United States Patent
Cohen et al.

(10) Patent No.: US 11,263,741 B2
(45) Date of Patent: Mar. 1, 2022

(54) SYSTEM AND METHODS OF GENERATING COMPARABLE REGIONS OF A LITHOGRAPHIC MASK

(71) Applicant: Applied Materials Israel Ltd., Rehovot (IL)

(72) Inventors: Boaz Cohen, Rehovot (IL); Gadi Greenberg, Rehovot (IL); Sivan Lifschitz, Rehovot (IL); Shay Attal, Rehovot (IL); Oded O. Dassa, Rehovot (IL); Ziv Parizat, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 119 days.

(21) Appl. No.: 16/752,353

(22) Filed: Jan. 24, 2020

(65) Prior Publication Data
US 2021/0233220 A1    Jul. 29, 2021

(51) Int. Cl.
*G06T 7/00* (2017.01)
*G03F 1/44* (2012.01)

(52) U.S. Cl.
CPC ............... *G06T 7/001* (2013.01); *G03F 1/44* (2013.01); *G06T 2207/30148* (2013.01)

(58) Field of Classification Search
CPC ... G03F 1/72; G03F 1/84; G06T 2207/30148; G06T 7/001; G06T 7/0004; G01N 21/95607; G01N 2021/95676
USPC .................. 356/237.1–237.6; 382/144, 146
See application file for complete search history.

(56) References Cited

U.S. PATENT DOCUMENTS

| | | | | |
|---|---|---|---|---|
| 6,246,787 B1 * | 6/2001 | Hennessey | ....... | G01N 21/95607 250/559.45 |
| 8,036,446 B2 | 10/2011 | Ikenaga et al. | | |
| 9,542,586 B2 * | 1/2017 | Matsumoto | ......... | G03F 7/70616 |
| 9,733,640 B2 | 8/2017 | Yiin et al. | | |
| 9,747,518 B2 | 8/2017 | Zhao et al. | | |
| 9,766,185 B2 | 9/2017 | Sezginer et al. | | |
| 2003/0104288 A1 * | 6/2003 | Pang | ......................... | G06T 7/97 430/5 |
| 2003/0197857 A1 * | 10/2003 | Yamashita | ....... | G01N 21/95607 356/237.2 |
| 2008/0037860 A1 * | 2/2008 | Yamashita | ............... | G06K 9/32 382/149 |
| 2009/0129664 A1 * | 5/2009 | Tsuchiya | ................. | G06T 7/001 382/149 |
| 2009/0297019 A1 * | 12/2009 | Zafar | ....................... | G03F 1/84 382/145 |

(Continued)

*Primary Examiner* — Isiaka O Akanbi
(74) *Attorney, Agent, or Firm* — Kilpatrick Townsend & Stockton LLP

(57) ABSTRACT

Implementations of the disclosure provide methods for generating an in-die reference for die-to-die defect detection techniques. The inspection methods using in-die reference comprise finding similar blocks of a lithographic mask, the similar blocks are defined by similar CAD information. A comparison distance is selected based on (i) areas of the similar blocks and (ii) spatial relationships between the similar blocks. The similar blocks are aggregated, based on the comparison distance, to provide multiple aggregated areas; and comparable regions of the lithographic mask are defined based on the multiple aggregate blocks. Images of at least some of the comparable regions of the lithographic mask are acquired using an inspection module. The acquired images are compared.

19 Claims, 18 Drawing Sheets

(56) References Cited

U.S. PATENT DOCUMENTS

| | | | | |
|---|---|---|---|---|
| 2010/0074513 A1* | 3/2010 | Tamamushi | ............... | G03F 1/84 |
| | | | | 382/144 |
| 2011/0170091 A1* | 7/2011 | Chang | ................... | G03F 7/7065 |
| | | | | 356/237.5 |
| 2016/0025648 A1* | 1/2016 | Duffy | ..................... | H01J 37/26 |
| | | | | 356/237.5 |
| 2017/0206433 A1* | 7/2017 | Ogawa | ..................... | G06T 7/74 |

* cited by examiner

SYSTEM AND METHODS OF GENERATING COMPARABLE REGIONS OF A LITHOGRAPHIC MASK

BACKGROUND

Lithographic masks are exposed during a lithographic process to radiation thereby forming patterns on a wafer.

A lithographic mask error may result in a large number of defective wafers. Different mask errors may be associated with different costs.

There is a need to rigorously inspect lithographic masks as the cost associated with some lithographic masks error is high.

Lithographic masks include multi-die lithographic masks and single die lithographic masks. A multiple-die mask, once exposed during a lithographic process, may form multiple dies. A single-die mask, once exposed sequentially during a lithographic process, may form multiple dies.

Multi-die lithographic masks may be inspected using die-to-die comparison.

Single dies lithography masks cannot be inspected using die do die comparison.

There is a growing need to provide accurate and fast methods for inspecting a lithographic mask without using die to die comparison.

SUMMARY

Aspects and implementations of the present disclosure are directed to inspecting a lithographic mask using in-die reference for die-to-die defect detection techniques. The methods disclosed employ the following operational steps: finding similar blocks of a lithographic mask; the similar blocks are defined by similar CAD information; selecting a comparison distance based on (i) areas of the similar blocks and (ii) spatial relationships between the similar blocks; aggregating the similar blocks, based on the comparison distance, to provide multiple aggregated areas; and defining the comparable regions of the lithographic mask based on the multiple aggregate blocks. Additional operational steps can be: acquiring images of at least some of the comparable regions; and comparing the images of the at least some of the comparable regions to provide an inspection result.

In certain implementations, the defining of the comparable regions may comprise at least one out of: (i) ignoring aggregated areas that fail to pass a size criterion; and (ii) adding stripe-shaped aggregated areas to each other.

In certain implementations, the selecting of the comparison distance may comprise calculating, for each distance of a set of distances, an aggregate area of similar blocks that are spaced apart by the distance thereby providing a set of aggregate areas. Alternatively, the selecting of the comparison distance may comprise finding a highest aggregate area of the set of aggregate areas; and defining the distance associated with the highest aggregate area as the comparison distance.

In certain implementations, the providing of the set of aggregate areas is preceded by selecting the set of distances. The selecting of the set of distances may comprise ignoring distances that are below a distance threshold. The methods may comprise repeating the providing of the set of aggregate areas for different sets of distances.

In certain implementations, the aggregating of the similar blocks may comprise defining consecutive stripes, wherein a width of each of the consecutive stripes equals the comparison distance; finding within each pair of adjacent stripes of the consecutive stripes, similar blocks that are spaced apart by the comparison distance; and ignoring blocks within each pair of the adjacent stripes that fail to have similar blocks that are spaced apart by the comparison distance.

In certain implementations, the methods may comprise repeating the steps of selecting the comparison distance, aggregating the similar blocks, and defining the comparable regions for each direction out of multiple directions that are oriented to each other.

The systems disclosed include a computer system implementing any one or more of the methods described herein. In certain implementations, the computer system is connected to or integrated with an inspection system. The inspection system comprises a mechanical stage for carrying a lithographic mask to be inspected and an image acquisition module for acquiring images of parts or all of the lithographic mask.

In certain implementations, the systems comprise a non-transitory computer-readable storage medium on which may be stored instructions encoding any one or more of the methods described herein.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
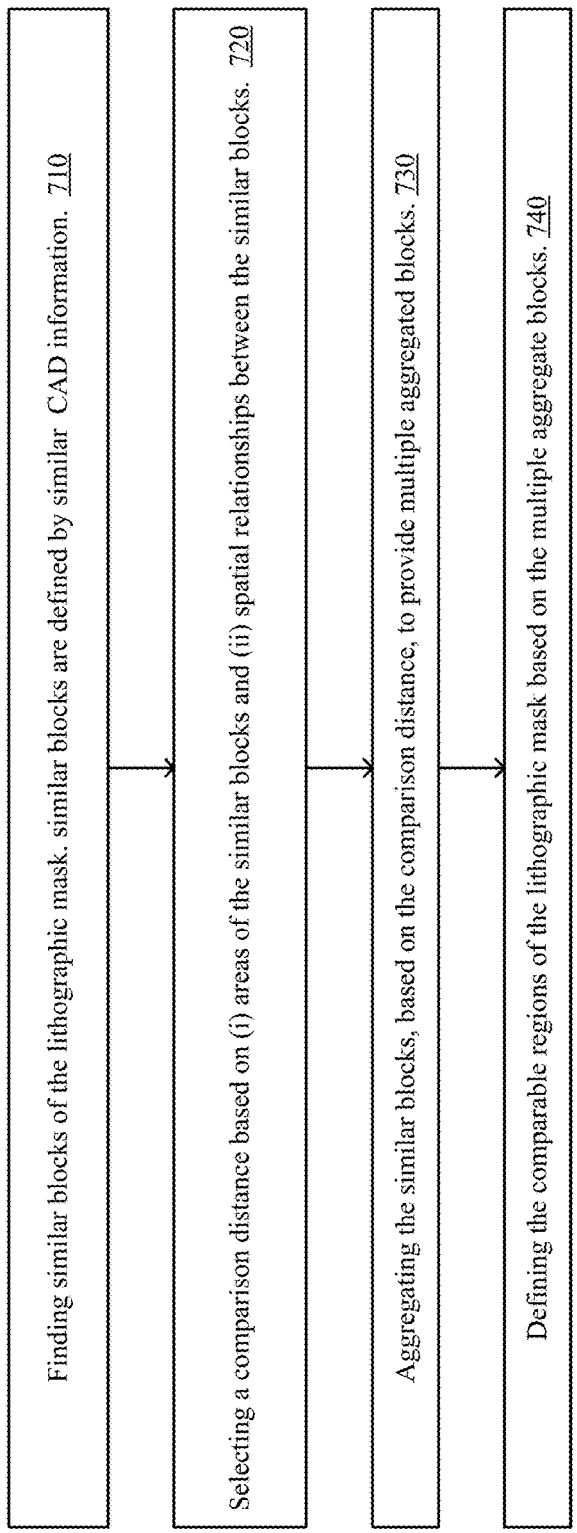
FIGS. 1, 3 and 4 depict flow diagrams of methods for generating in-die reference in accordance with one or more aspects of the present disclosure.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The detection of defects on masks and wafers using die-to-die defect detection techniques is well known: an image of a measured die is compared to an image of a reference die; differences between the die images are analyzed for the detection of defects. The reference die may be another die on the same mask or wafer.

The defect-free fabrication of single die masks poses a challenge for using die-to-die techniques. For example, in the inspection of single die masks there is no reference die.

According to embodiments of the invention there is provided a method for generating an in-die reference for die-to-die defect detection techniques. The reference is generated by defining comparable regions in a die based on analyzing the die design data, and by imaging those comparable regions by an inspection tool. A dedicated imaging plan may be generated for the inspection tool with respect to the comparable regions. The comparable regions may be defined such that the dedicated imaging plan would be optimized with respect to operational considerations relating the operation of the inspection tool. For example, the scanning of the comparable regions may require fewer changes to the direction of the mechanical stage of the inspection tool.

Once available, the images of the comparable regions may be used for defect detection using known die-to-die defect detection techniques.

FIG. 1 illustrates method 700 according to an embodiment of the invention.

Method 700 is for generating comparable regions using computer aided design information.

Method 700 may start by step 710 of finding similar blocks of the lithographic mask. The term 'block' as used herein relates to a portion of an area of the lithographic mask die. Each block of the lithographic mask is defined by computer aided design information. Alternatively, the blocks can be defined using the mask's 'design intent' information. Post-OPC information may also be used. The invention is not limited by the specific technique that is used for finding similar blocks and known techniques for similarity analysis can be used.

The blocks may be defined as corresponding to a functional criterion, for example—CPU core, memory regions and the like. The blocks may be defined based on size criterion: a block may be defined as a mask area large enough so that image registration inaccuracies, edge imaging effects, throughput implications and other imaging factors and operational consideration would not deteriorate the efficiency and integrity of the inspection and detection. According to embodiments of the invention, the blocks are automatically defined based on design information and by employing a similarity criterion. Alternatively, the blocks, and/or the size of the blocks, may be pre-defined, or set empirically based on trial and error testing during a preliminary set-up phase.

To illustrate, given a lithographic mask of the area of 10 cm×10 cm and a typical pixel size of few nanometers, for example 30 nm×30 nm or less, a block size—a minimal comparable region size—may be defined at the order of few hundred nanometers—for example, 100 nm×100 nm; few hundred microns, for example, 100µ×100µ; few hundred millimeters—for example, 100 mm×100 mm, and more. According to embodiments of the invention, a minimum block size can be set. The invention is not limited by the shape of the blocks and comparable regions, and for simplicity the examples listed above relate to a square shape.

Similar blocks are defined by similar computer aided design information.

Following known technique for evaluating similarity, the term "similar" means identical up to an allowable deviation. The allowable deviation may refer to an allowable number of different patterns, to an allowable number of block segments that differ from each other.

The allowable deviation may be a pre-defined value, a value defined by a manufacturer of the lithographic mask, by a mask shop, by a programmer or by an inspection tool user.

When comparing two blocks—a non-limiting example of an allowable deviation between the two blocks—is having up to one, two, three, four of five (or even more) percent corresponding block segments that differ from each other. Corresponding block segments are located at the same location within the pair of blocks.

According to another embodiment (not shown in FIG. 4), step 710 is replaced with an alternative step of receiving similar blocks of the lithographic mask. For example, die layout information may be provided from another system or by a user.

After the similar blocks are found there is a need to find repeating combinations of similar blocks.

The repeating combination may be determined with relation to a comparison distance—a characteristic that corresponds to the repetition cycle of the repeating combinations of similar blocks.

Step 710 may be followed by step 720 of selecting a comparison distance based on (i) areas of similar blocks of the lithographic mask of the object and (ii) spatial relationships between the similar blocks; wherein similar blocks are defined by similar CAD information.

The spatial relationships may include the distances between the similar blocks.

It may be desired to provide comparable regions that include multiple similar blocks. The inspection of the lithographic mask may benefit from comparable regions that include multiple similar blocks. (higher signal to noise ratio, higher robustness)

Step 720 may be followed by step 730 of aggregating the similar blocks, based on the comparison distance, to provide multiple aggregated areas.

Step 730 may be followed by step 740 of defining the comparable regions of the lithographic mask based on the multiple aggregate blocks.

The comparable regions define regions of a lithographic mask that should be compared to each other when the lithographic mask is inspected. The comparable regions may be included in an inspection recipe. For example, the location of the comparable regions may be used for setting the image acquisition plan of the inspection tool.

The comparable regions may be stored, sent to another system, used to inspect the lithographic mask, and the like.

Figure 2:
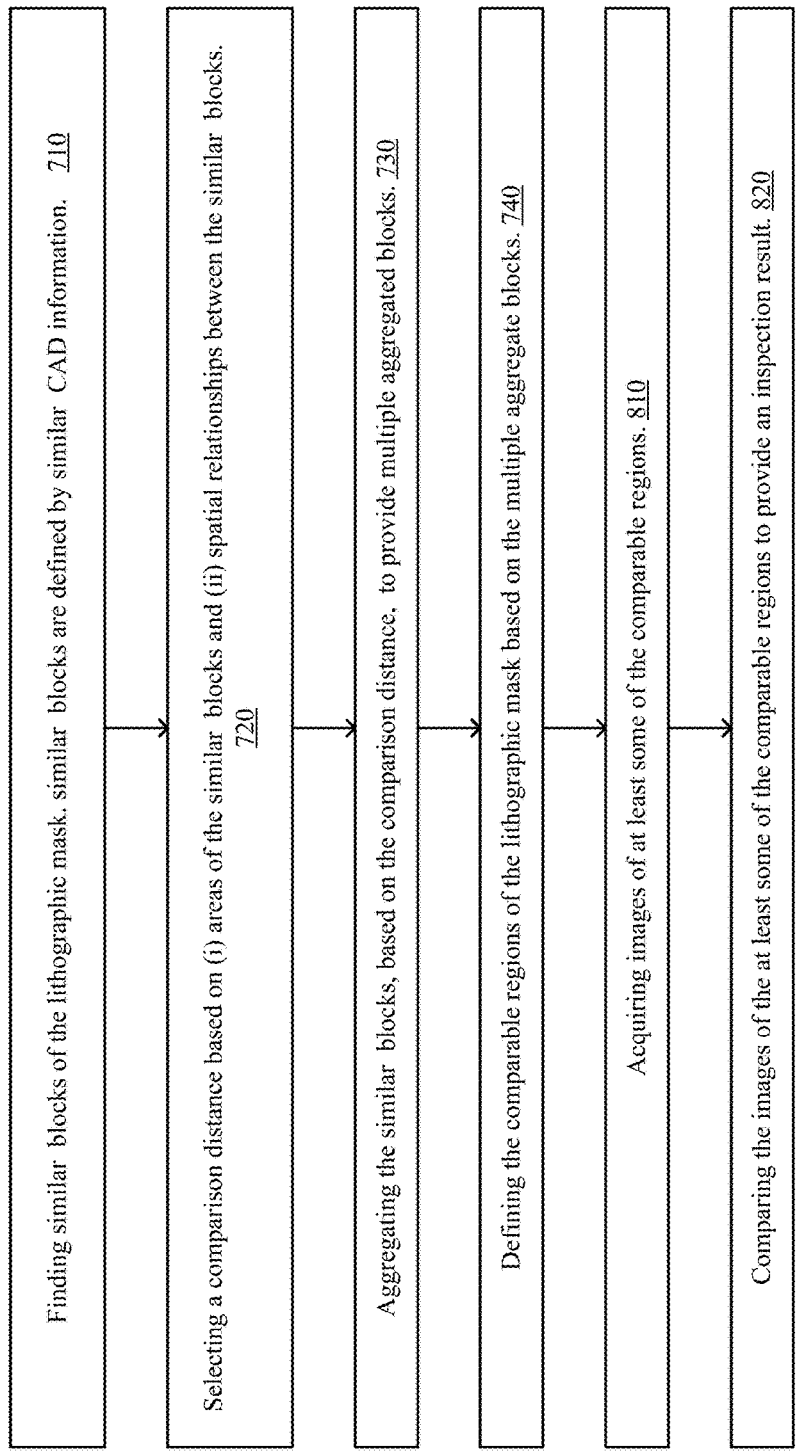
FIG. 2 depicts a flow diagram of a method for inspecting a lithographic mask in accordance with one or more aspects of the present disclosure.

FIG. 2 illustrates method 701 according to an embodiment of the invention.

Method 701 is for inspecting a lithographic mask. The inspection uses comparable regions.

Method 701 may start by a sequence of steps that includes steps 710, 720 and 730.

Step 740 may be followed by step 810 of acquiring images of at least some of the comparable regions.

Step 810 may include acquiring images of two, some or all of the comparable regions found during step 740.

Step 810 may include acquiring the images by an inspection system or any other system that illuminates the lithographic mask (or at least illuminates the at least some of the comparable regions) with radiation and senses radiation resulting from the illumination.

Alternatively, step 810 may include retrieving the images of at least some of the comparable regions without generating the images. Step may include, for example, retrieving the images from a memory unit, from an inspection system, and the like.

Step 810 may be followed by step 820 of comparing the images of the at least some comparable regions to provide an inspection result.

There may be provided an inspection method that may start by receiving information about the comparable regions. The receiving may be followed by steps 810 and 820.

According to an embodiment of the invention the spatial relationships between the similar blocks and especially the distances between similar blocks may be responsive to multiple directions. The multiple directions may include directions that are oriented in relation to each other by ninety degrees or by any other angular deviation.

Assuming, for example, that the multiple directions include the X-axis and the Y-axis. In this case the generating comparable regions include defining X-axis comparable blocks and defining Y-axis comparable regions.

The defining of the X-axis comparable blocks may include selecting an X-axis comparison distance based on spatial relationships along the X-axis, aggregating the similar blocks and defining X-axis comparable regions.

The defining of the Y-axis comparable blocks may include selecting of the comparison distance may include selecting a Y-axis comparison distance based on spatial relationships along the Y-axis, aggregating the similar blocks and defining Y-axis comparable regions.

Figure 3:
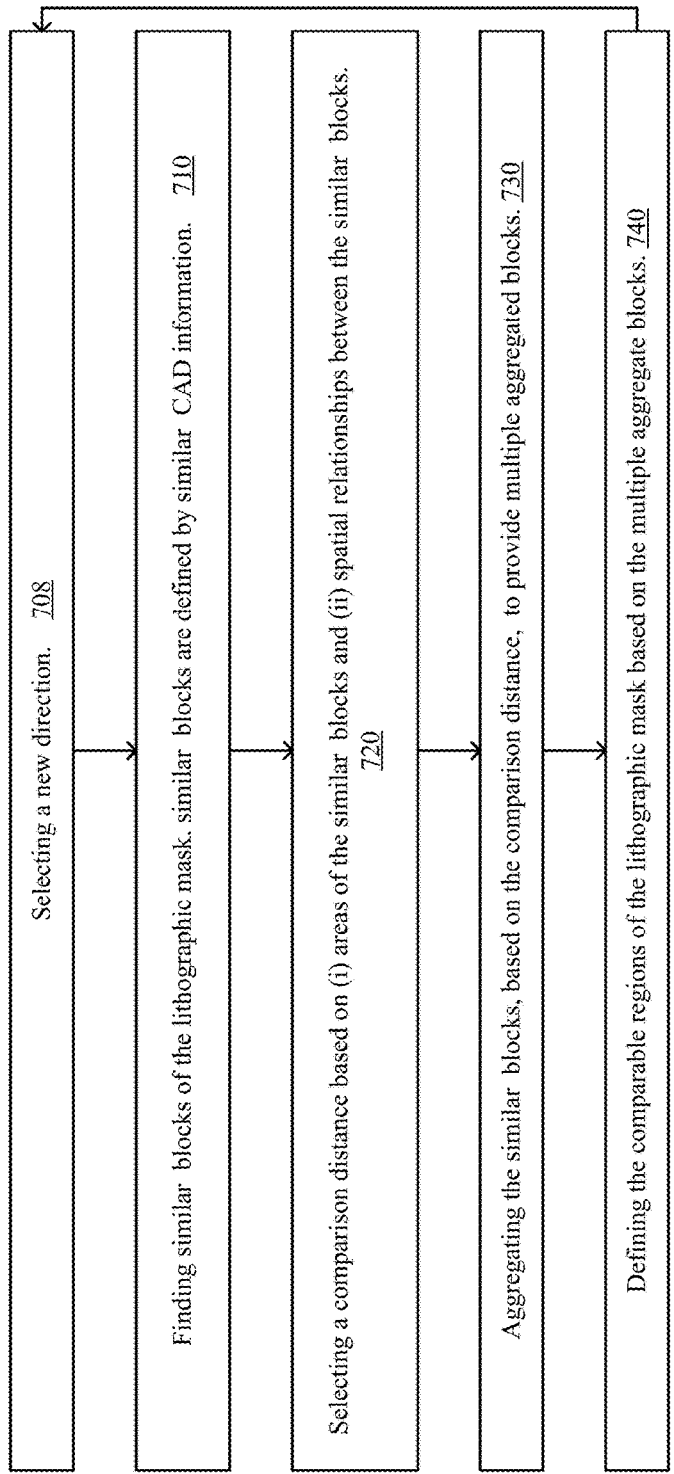

FIG. 3 illustrates method 702 according to an embodiment of the invention.

Method 702 may start by step 708 of selecting a new direction (for example—X-axis or Y-axis).

Step 708 may be followed by steps 710, 720, 730 and 740.

Step 740 may be followed by jumping to step 708.

When the directions are the X-axis and the Y-axis then two iterations of steps 710, 720, 730 and 740 are executed.

After completing all the iterations of steps 710, 720, 730 and 740 then comparable regions for multiple directions are found.

Comparable blocks for one or more directions may be used when inspecting the lithographic mask.

Accordingly—step 740 may be followed by steps 810 and 820.

Figure 4:
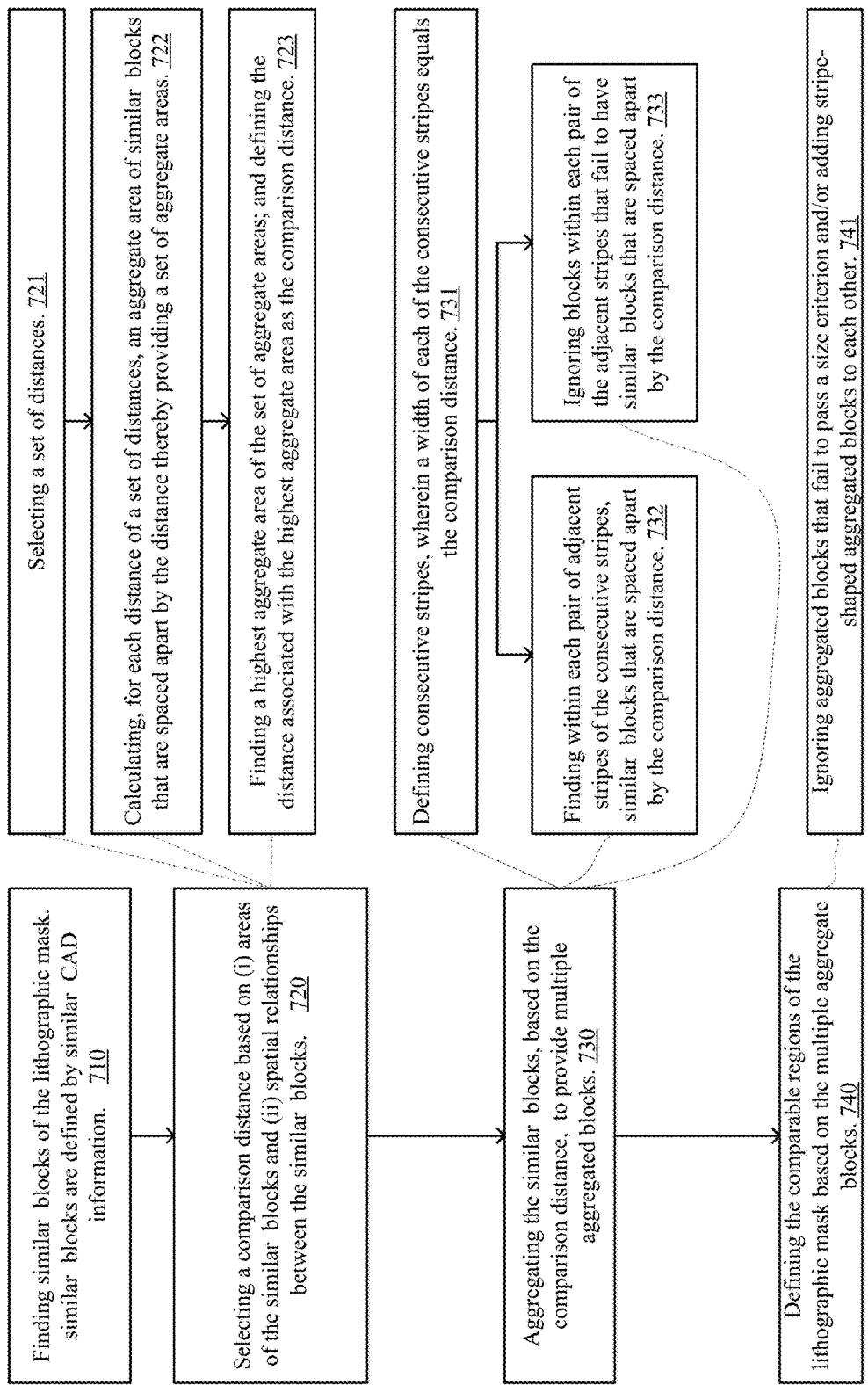

FIG. 4 illustrates method 703 according to an embodiment of the invention.

FIG. 4 illustrate some of the steps that may be included in steps 720, 730 and 740.

Step 720 may include steps 721, 722 and 723. Step 722 follows step 721 and is followed by step 723.

Step 721 may include selecting a set of distances. The set of distances may include multiple different distances. The comparison distance is selected out of the set of distances.

A minimal and/or maximal distance threshold may be selected and may remain fixed during the execution of method 703 or may be changed over time.

Figure 9:
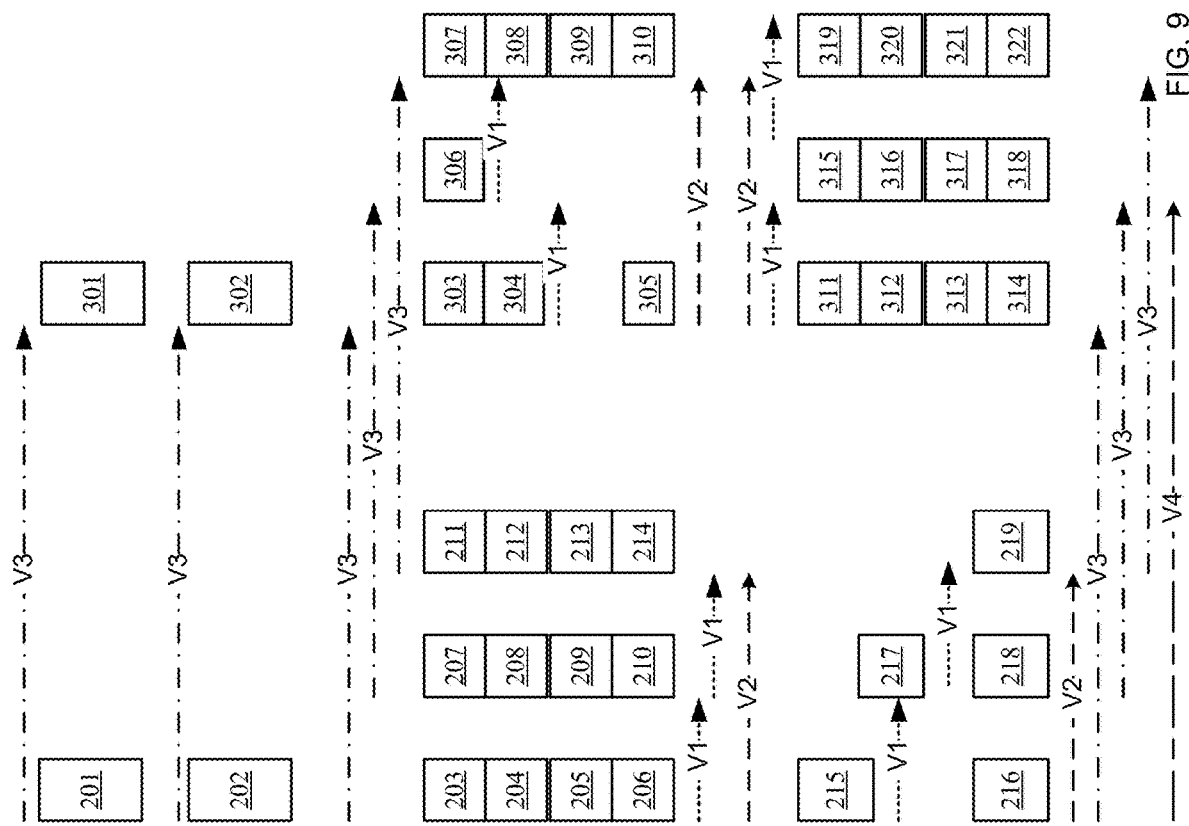

For example, FIG. 9 illustrates four distances V1, V2, V3 and V4 that are defined between different similar blocks that belong to two areas 200 and 300 of a lithographic mask.

Step 721 may be followed by step 722 of calculating, for each distance of a set of distances, an aggregate area of similar blocks that are spaced apart by the distance thereby providing a set of aggregate areas.

For example, see table 333 of FIG. 9.

Table 333 includes a column for each distance out of V1, V2, V3 and V4. Table 333 has three rows—one indicates the distance, another row ("related similar blocks") lists blocks that have a similar block that is spaced at a distance from the block and a third row indicates the aggregate size of all the similar blocks (Area(V1), Area(V2), Area(V3) and Area(V4)).

For distance V1—the related similar blocks include blocks 203-210, 215, 216, 218, 303-306, 311-318 and their aggregate size is denoted Area(V1).

For distance V2—the related similar blocks include blocks 203-206, 303-305, 311-314 and their aggregate size is denoted Area(V2).

For distance V3—the related similar blocks include blocks 201, 202, 203-214, 215-219 and their aggregate size is denoted Area(V3).

For distance V4—the related similar blocks include blocks 203, 207-210, 215-218 and their aggregate size is denoted Area(V4).

Step 722 may be followed by step 723 of finding a highest aggregate area of the set of aggregate areas; and defining the distance associated with the highest aggregate area as the comparison distance.

For example, referring to the example of FIG. 9 and assuming that Area(V1) is bigger than each one of Area(V2), Area(V3) and Area(V4)—then V1 is the comparison distance.

Step 730 may include steps 731, 732 and 733. Step 731 may be followed by steps 732 and 733.

Step 731 may include defining consecutive stripes, wherein a width of each of the consecutive stripes equals the comparison distance.

Step 732 may include finding within each pair of adjacent stripes of the consecutive stripes, similar blocks that are spaced apart by the comparison distance.

Step 733 may include ignoring blocks within each pair of the adjacent stripes that fail to have similar blocks that are spaced apart by the comparison distance.

Steps 731, 732 and 733 may be executed multiple times—for different comparison distances.

Step 740 may include step 741.

Step 741 may include at least one of the following: (i) ignoring aggregated areas that fail to pass a size criterion—for example the width and/or height of an aggregated block may be too small (below a predefined threshold), and (ii) adding stripe-shaped aggregated areas to each other.

Figure 5:
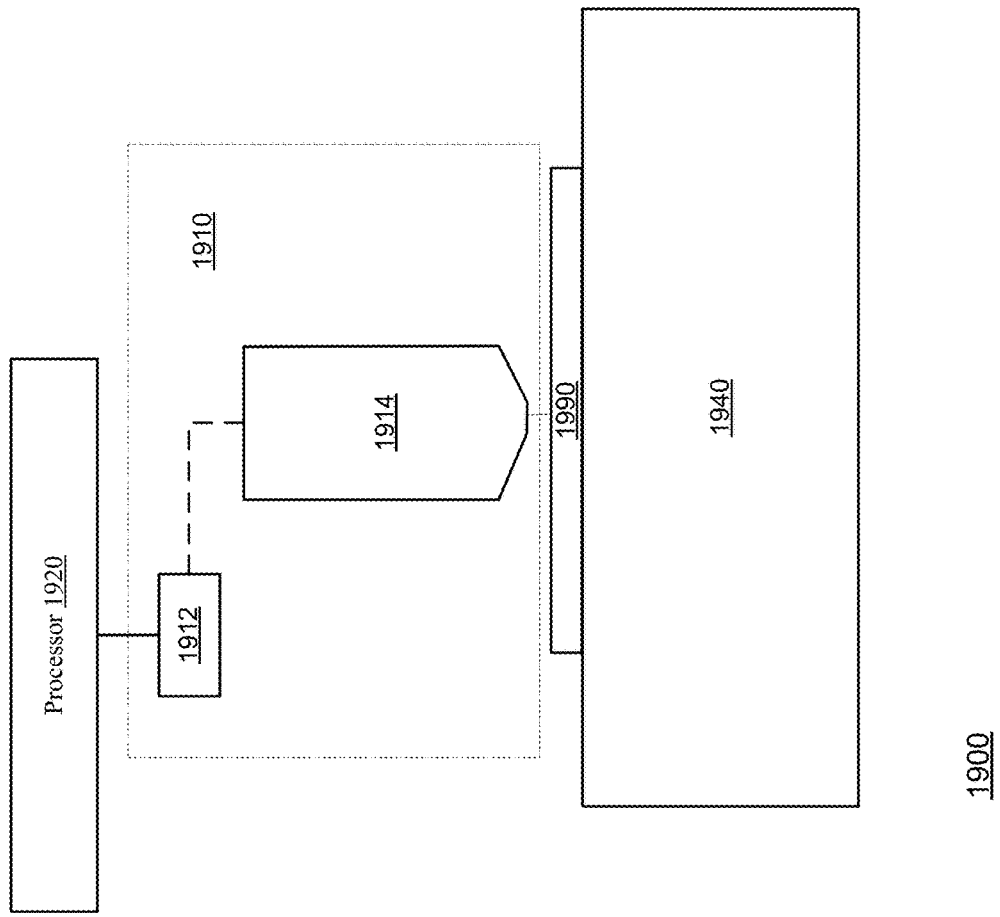
FIG. 5 depicts a block diagram of an illustrative inspection system operating in accordance with examples of the invention.

FIG. 5 illustrates a lithographic mask 1990 and an inspection system 1900 according to an embodiment of the invention.

Inspection system 1900 may include processor 1920, mechanical stage 1940 and image acquisition module 1910. The image acquisition module 1910 may include optics 1914 and controller 1912 for controlling the optics 1914.

The mechanical stage 1940 is configured to support and move the lithographic mask 1990 in relation to the image acquisition module 1910.

Optics 1914 is configured (under the control of controller 1912) is configured to illuminate the lithographic mask 1990 (or at least comparable regions of the lithographic mask 1990), to detect radiation resulting from the illumination and generate images of the lithographic mask 1990 (or the illuminated comparable regions).

Optics 1914 is configured (under the control of controller 1912) to illuminate the lithographic mask 1990 with any type of radiation (visible light, ultra violet, deep ultra violet, extreme ultra violet, electrons, ions), with one or more beams.

The image acquisition module 1910 may detect photons, electrons and/or ions.

The optics 1914 may detect transmissive radiation (that passes through lithographic mask 1990), scattered particles and/or photons, reflected particles and/or photons and the like.

Inspection system 1900 may be an aerial inspection system or not.

Processor 1920 may be configured to calculate the comparable regions, and additionally or alternatively to process detection signals from the image acquisition module 1910 to provide inspection results.

In some cases there is no need to aggregate blocks—as the blocks are large enough. Even in this case the selection of the areas that form the comparable regions is not trivial—and a tradeoff between throughput and accuracy should be made.

Figure 6:
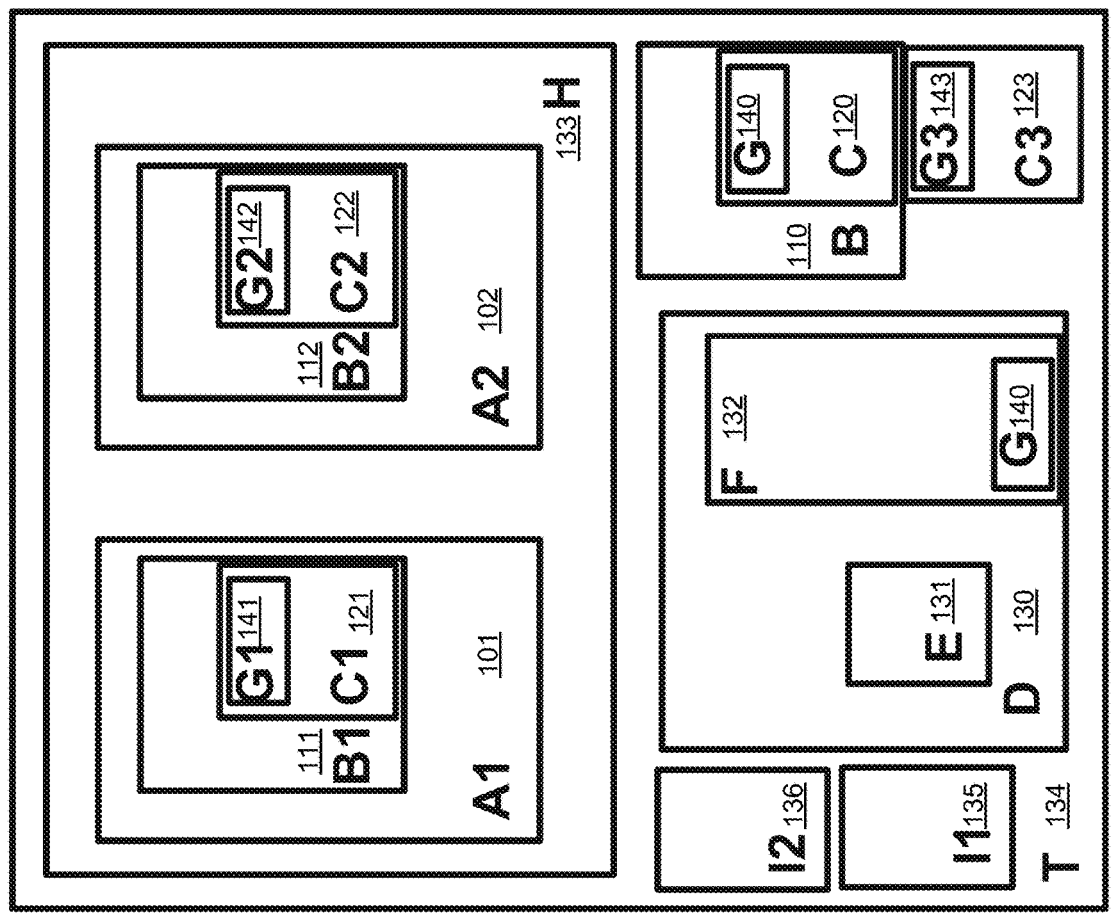
FIGS. 6-18 schematically depict areas of the lithographic mask illustrating aspects of the present disclosure.

FIG. 6 illustrates various areas of a lithographic mask 100 according to an embodiment of the invention.

The various areas include first level areas A1 101 and A2 102, second level areas B 110, B1 111 and B2 112, second level areas C 120, C1 121, C2 122 and C3 123, fourth level area D 130, fifth level area E 131, sixth level area F 132, seventh level areas G 140, G1 141, G2 142 and G3 143, eighth level area H 133, ninth level areas I1 135 and I2 136, as well as tenth level area T 134.

First level area A1 101 includes second level area B1 111, third level area C1 121 and seventh level area G1 141.

First level area A2 102 includes second level area B2 112, third level area C2 122 and seventh level area G2 142.

First level areas A1 101 and A2 102 are similar to each other. Assuming that first level areas A1 101 and A2 102 are defined as comparable regions there is still a question of whether to defined second level areas B1 111 and B2 112 as comparable regions.

Because second level areas B1 111 and B2 112 are already included in comparable regions (first level areas A1 101 and A2 102)—then the comparison of the second level areas B1 111 and B2 112 seems to be redundant.

On the other hand—if second level areas B1 111 and B2 112 are not defined as comparable regions—second level area B 110 (that is located outside first level areas A1 101 and A2 102) cannot be evaluated—as second level area B 110 does not have a comparable region to be compared to.

The same considerations are applicable to the definition of third level areas C1 121 and C2 122 as comparable regions.

The same considerations may be applied to the definition of seventh level areas G1 141 and G2 142 as comparable regions. Although there are two seventh level areas (G 140 and G3 143) outside first level areas A1 101 and A2 102—and it is easier not to define seventh level areas G1 141 and G2 142 as comparable regions.

According to an embodiment a predefined number of areas should be selected out of a certain number of highest level areas. The predefined number and the certain number may be defined by a user of the inspection tool, by a manufacturer of the lithographic mask, aby a mask shop, and the like.

Figure 7:
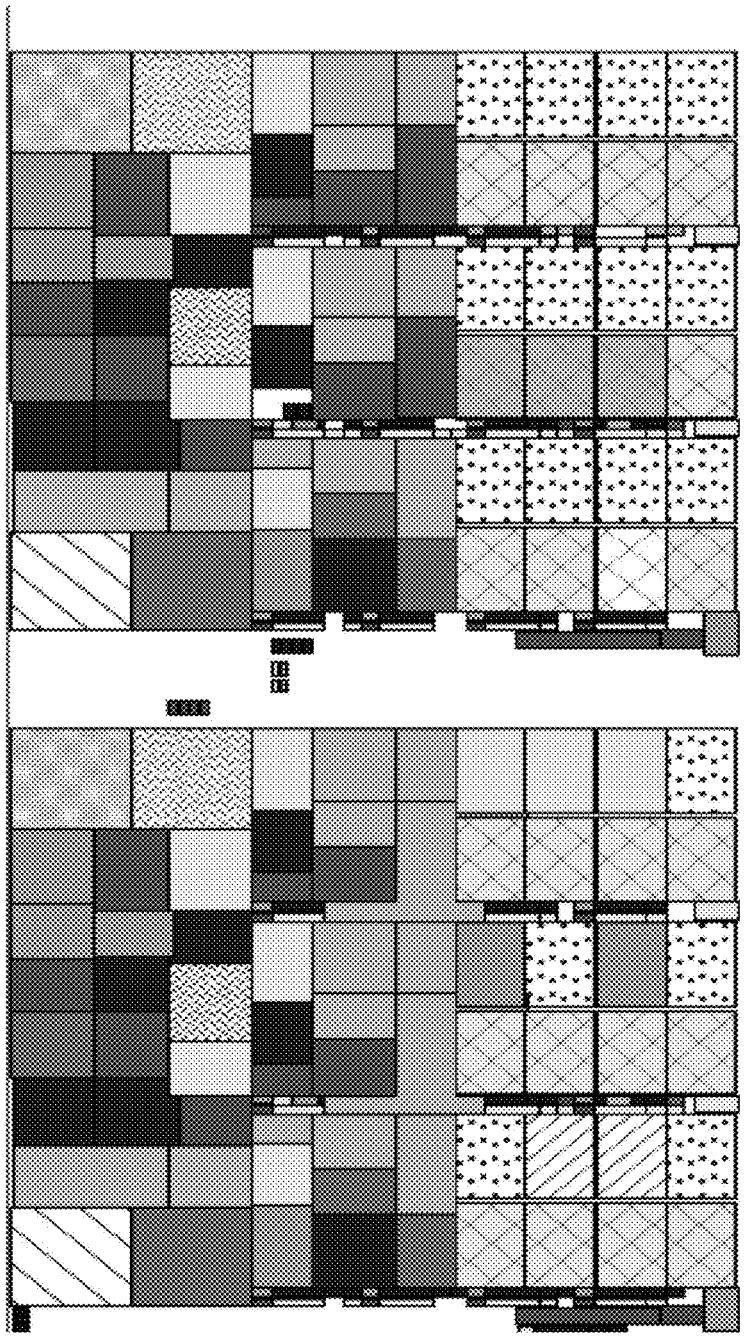

FIG. 7 illustrates various areas 200 and 300 of a lithographic mask according to an embodiment of the invention.

Areas 200 and 300 include multiple similar blocks of different types.

Figure 8:
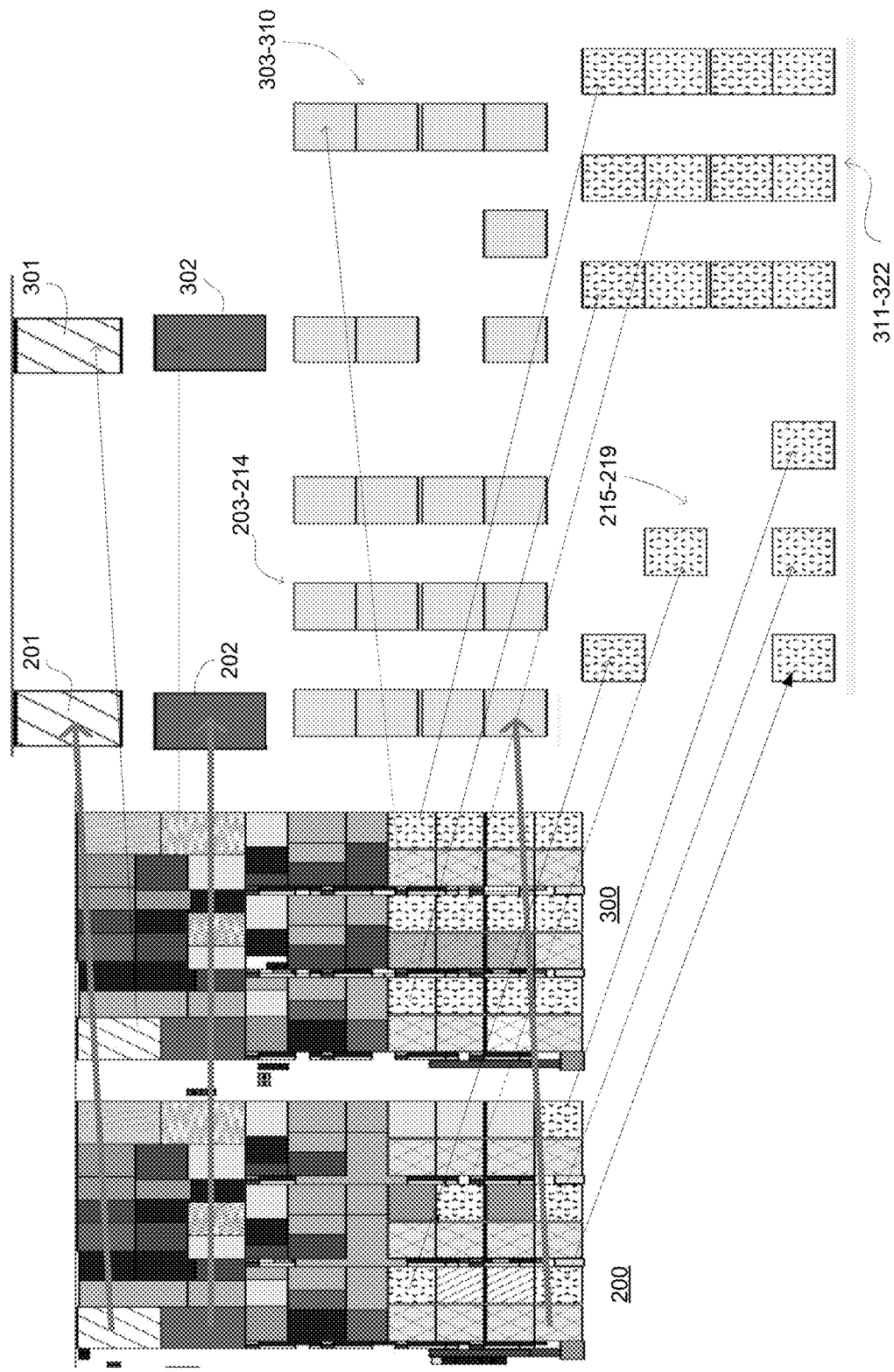

FIG. 8 illustrates various areas 200 and 300 of a lithographic mask and similar blocks 201-219 and 301-322 of the various areas according to an embodiment of the invention.

Blocks 201-219 belong to area 200 while blocks 301-322 belong to area 300.

Blocks 201 and 301 are similar to each other.

Blocks 202 and 302 are similar to each other.

Blocks 203-214 and 303-310 are similar to each other.

Blocks 215-219 and 311-322 are similar to each other.

Figure 10:
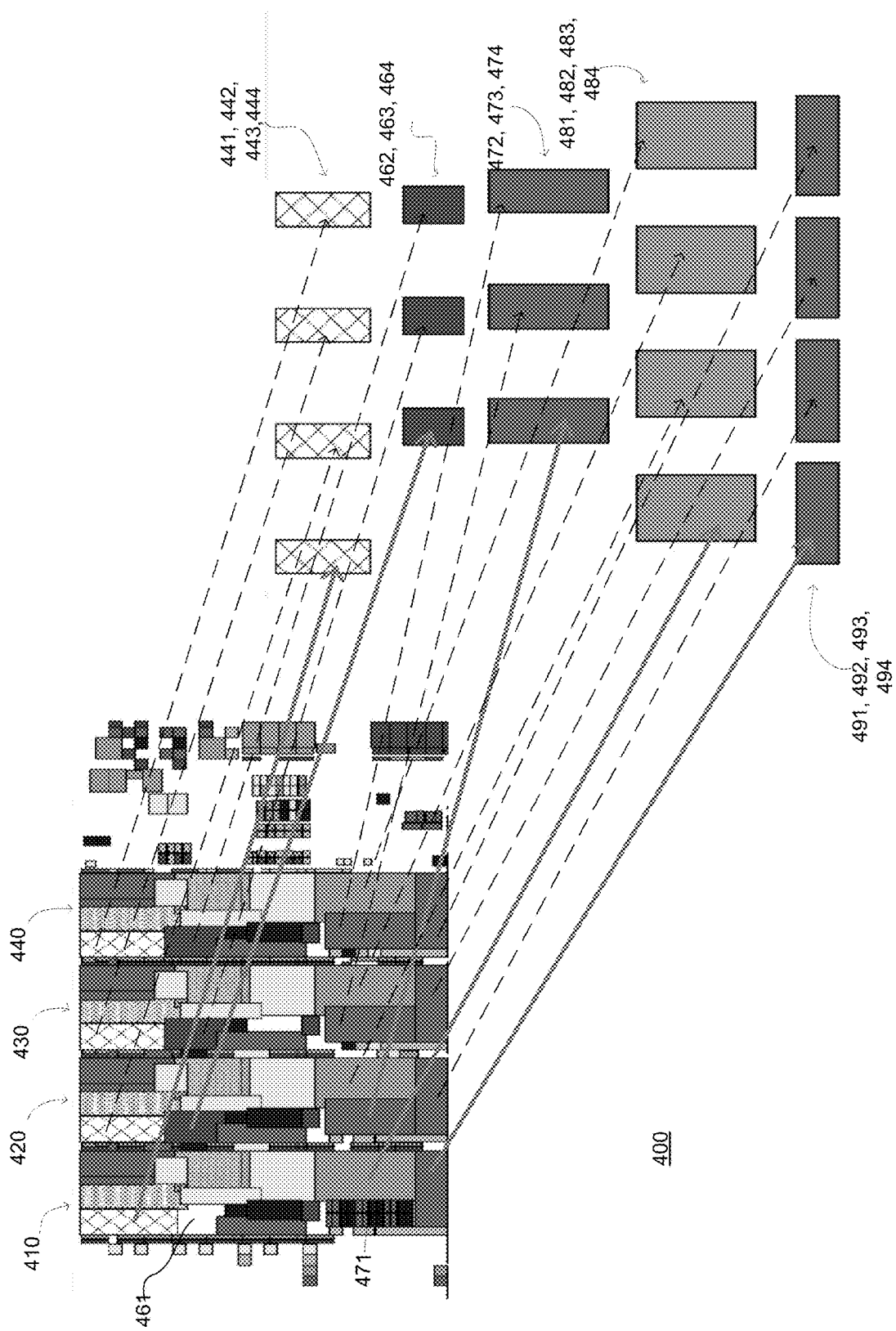

FIG. 10 illustrates areas 410, 420, 430 and 440 of a lithographic mask according to an embodiment of the invention.

Areas 410, 420, 430 and 440 form a sequence of four consecutive stripes. Areas 410, 420, 430 and 440 are substantially identical to each other—and include similar blocks such as (i) blocks 441, 442, 443 and 444 that are similar to each other, (ii) blocks 462, 463 and 464 that are similar to each other, (iii) blocks 472, 473 and 474 that are similar to each other, (iv) blocks 481, 482, 482 and 484 that are similar to each other, and (v) blocks 491, 492, 493 and 494 that are similar to each other.

Blocks 441, 481 and 491 belong to area 410.

Blocks 442, 462, 472, 482 and 492 belong to area 420.

Blocks 443, 463, 473, 483 and 493 belong to area 430.

Blocks 444, 464, 474, 484 and 494 belong to area 440.

Block 461 belongs to area 410 and differs from corresponding blocks 462, 463 and 464.

Block 471 belongs to area 410 and differs from corresponding blocks 472, 473 and 474.

Figure 11:
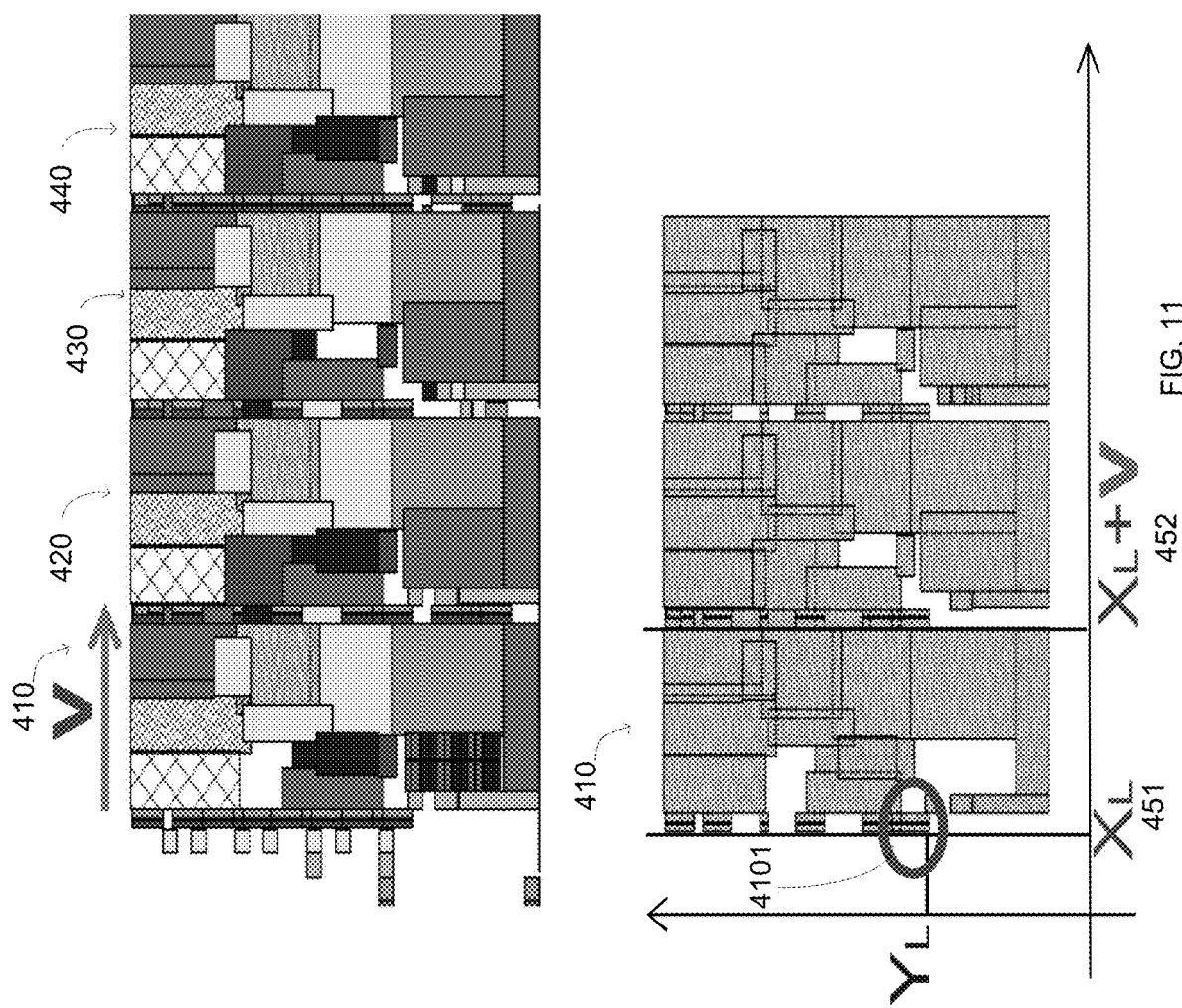

FIG. 11 illustrates areas 410, 420, 430 and 440 of a lithographic mask according to an embodiment of the invention.

FIG. 11 illustrates that the comparison distance V equals the width of area 410.

FIG. 11 illustrates areas of the lithographic mask after a first iteration of the aggregating of similar blocks, based on the comparison distance. In FIG. 11 the first area 410 is defined as ranging between (i) a leftmost block 4101 having a left border that has an X-axis value of $X_L$ 451 and (ii) a right border that has an X-axis value of $X_L$+V 452.

Figure 12:
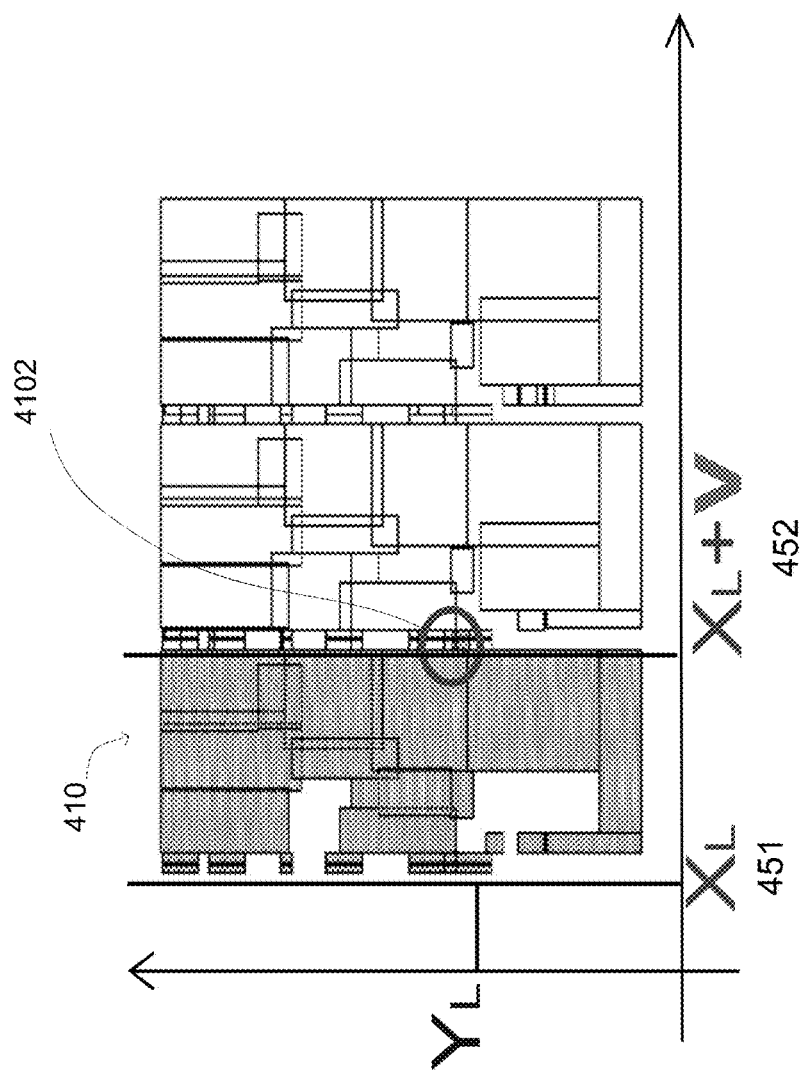

FIG. 12 illustrates areas 410, 420, 430 and 440 of a lithographic mask according to an embodiment of the invention.

FIG. 12 illustrates that a block 4102 that extends beyond the left border is truncated.

Blocks of area 410 (after truncating block 4102) should be compared to blocks of area 420.

Figure 13:
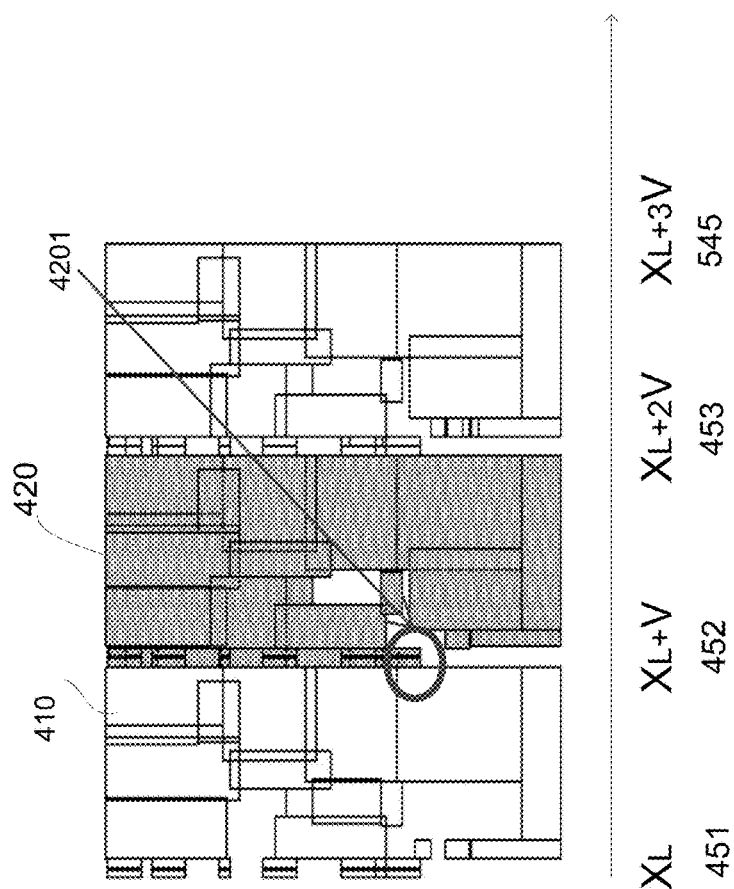

FIG. 13 illustrates areas of the lithographic mask after a second iteration of the aggregating of similar blocks, based on the comparison distance. In FIG. 12 the second area 420 is defined as ranging between (i) a leftmost block 4201 having a left border that has an X-axis value of $X_L$+V 452 and (ii) a right border that has an X-axis value of $X_L$+2V 453.

Figure 14:
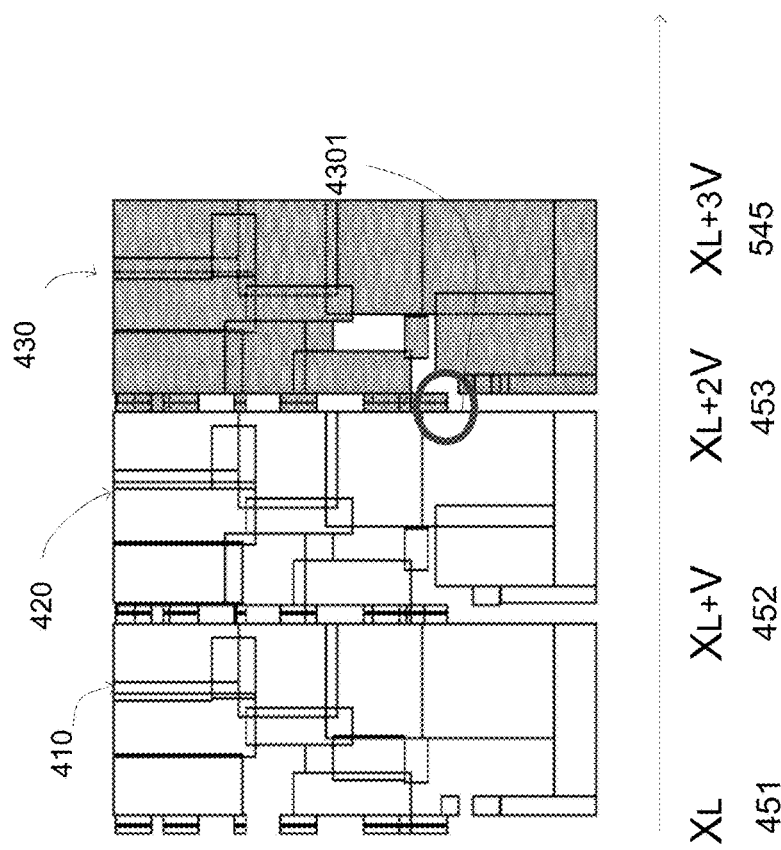

FIG. 14 illustrates areas of the lithographic mask after a third iteration of the aggregating of similar blocks, based on the comparison distance. In FIG. 13 the third area 430 is defined as ranging between (i) a leftmost block 4301 having a left border that has an X-axis value of $X_L$+3V 453 and (ii) a right border that has an X-axis value of $X_L$+3V 454.

The blocks of third area 430 are compared to the blocks of fourth area 440.

The outcome of the aggregation of the blocks of areas 410, 420, 430 and 440 may result in defining each one of areas 410, 420, 430 and 440 as an aggregated area. Alternatively, the outcome the aggregation of the locks of areas 410, 420, 430 and 440 may result as defining the combination of areas 410 and 420 as one aggregated area and defining the combination of areas 430 and 440 as another aggregated area.

If the lithographic mask includes another instance of areas 410, 420, 430 and 440 that the combination of areas 410, 420, 430 and 440 may be regarded as a single aggregated area.

Figure 15:
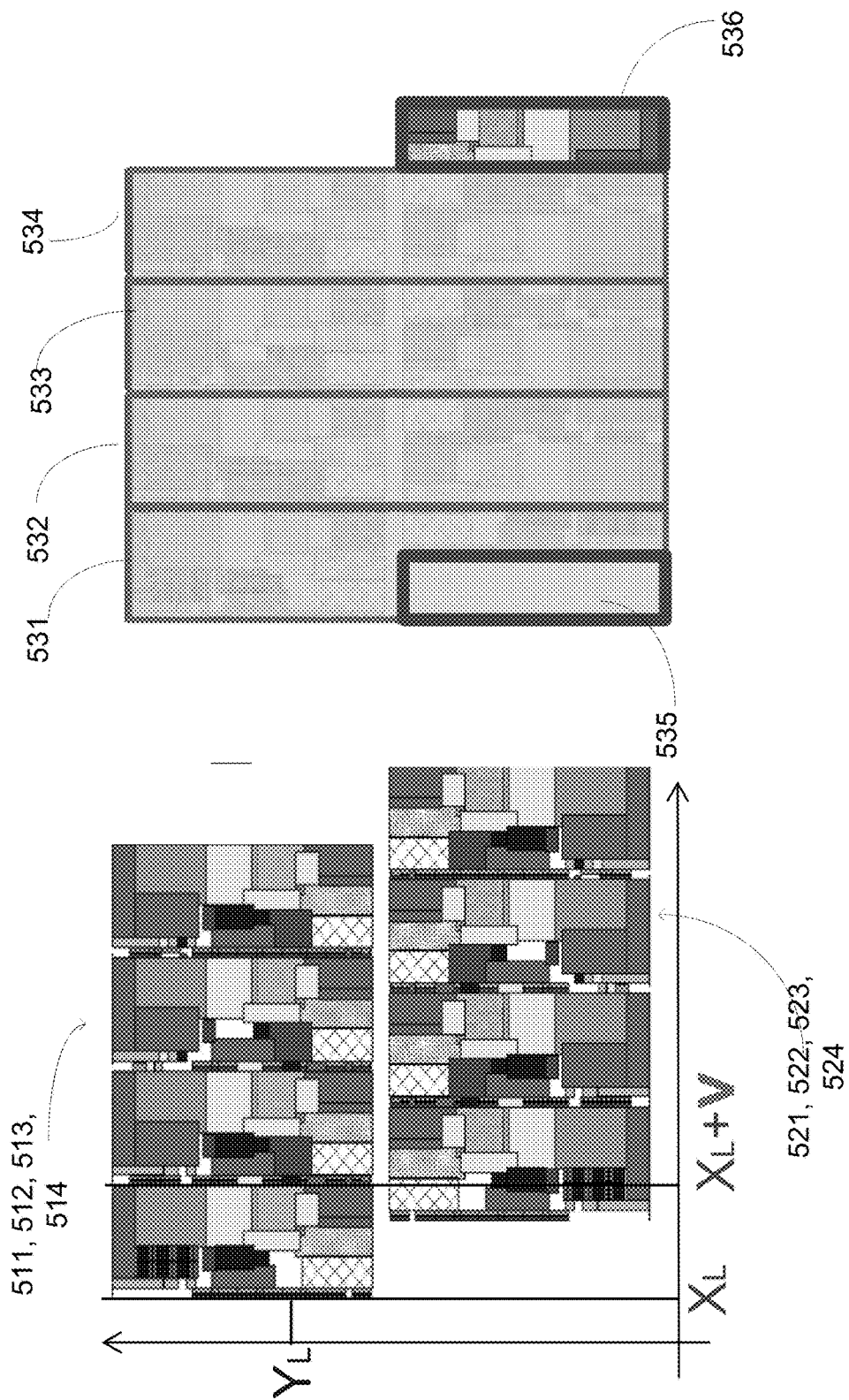

FIG. 15 illustrates areas 511-514, 521-524, aggregated areas 531-534 and segments 535 and 536 of a lithographic mask according to an embodiment of the invention.

Areas 511, 512, 513, 514, 521, 522, 523 and 524 are similar to each other and are arranged in two sequences of areas. A first sequence of areas includes areas 511-514. A second sequence of areas includes areas 524-524.

The first sequence of areas is positioned above the second sequence of areas. The first sequence of areas shifted to the left in comparison to the second sequence of areas.

FIG. 15 also illustrates four comparable areas 531, 532, 533 and 534.

Comparable area 531 has a rectangular shape and includes a part of area 511 and area 521. Comparable area 532 has a rectangular shape and includes area 512 and area 522. Comparable area 533 has a rectangular shape and includes area 513 and area 523. Comparable area 534 has a rectangular shape and includes area 514 and a part of area 524.

Because the left shift between the first and second sequences of areas the comparable area 531 includes segment 535.

Because the left shift between the first and second sequences of areas segment 536 is outside the comparable area 534.

Void 535 and certain parts 536 are not compared to any corresponding parts. Accordingly—the definition of the comparable areas is flawed.

Figure 16:
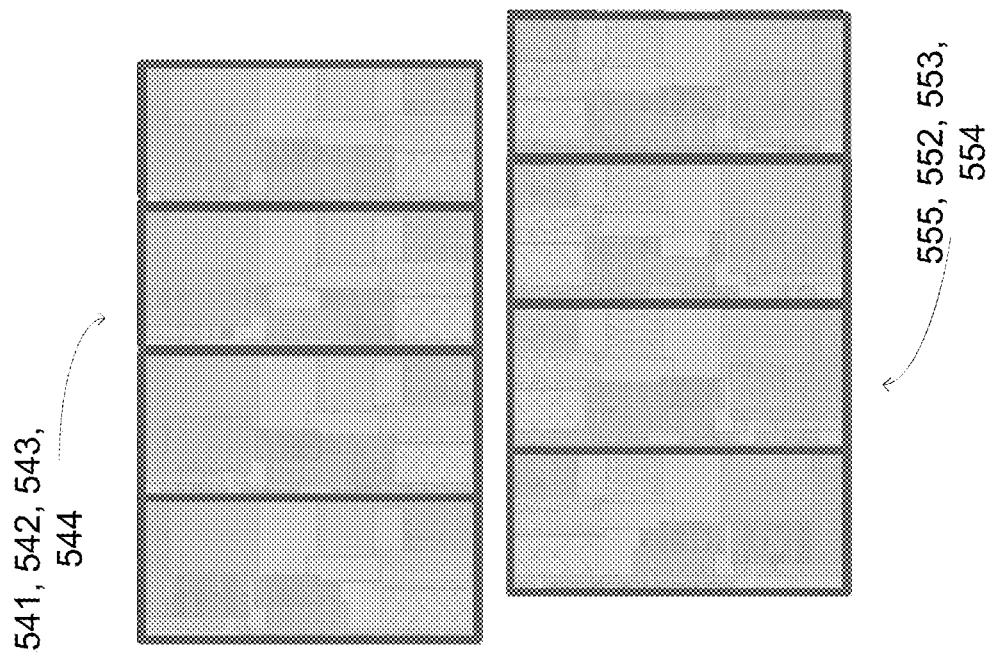
Figure 16:
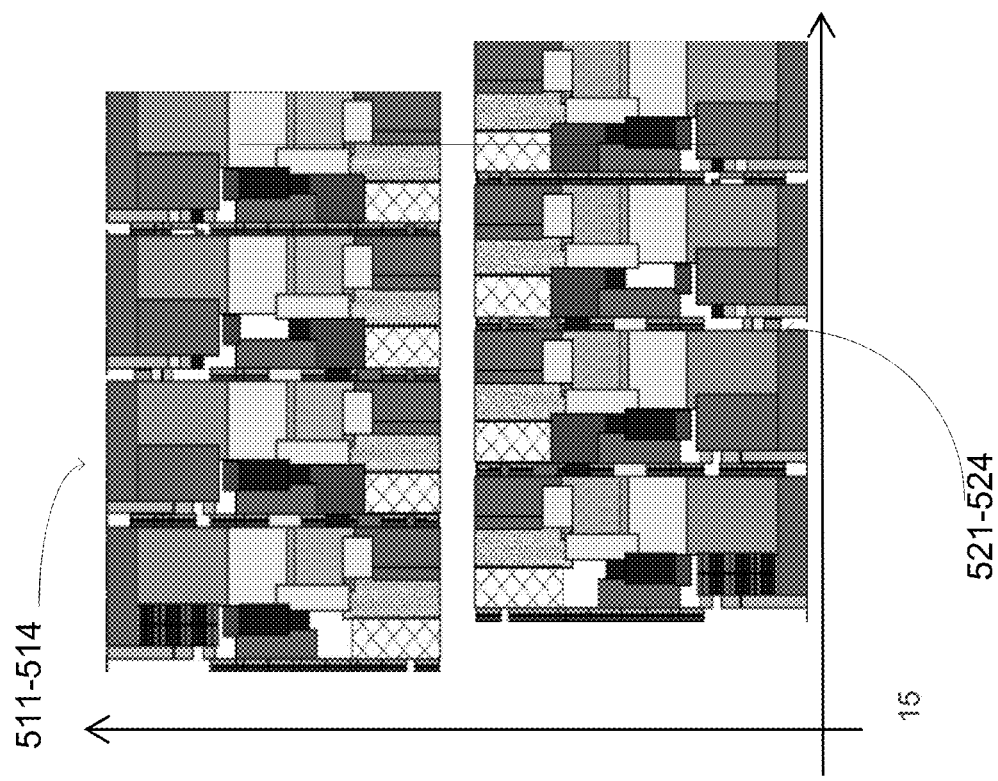

FIG. 16 illustrates areas 511-514, 521-524, aggregated areas 541-544 and aggregated areas 551-554 of a lithographic mask according to an embodiment of the invention.

Aggregated area 541 includes area 511, aggregated area 542 includes area 512, aggregated area 543 includes area 513 and aggregated area 544 includes area 514.

Aggregated area 552 includes area 521, aggregated area 552 includes area 522, aggregated area 553 includes area 523 and aggregated area 554 includes area 524.

It is noted that one aggregated area can include the combination of areas 511 and 512 and another aggregated area may include the combination of areas 513 and 514.

It is noted that one aggregated area can include the combination of areas 521 and 522 and another aggregated area may include the combination of areas 523 and 524.

It should also be noted that one aggregated area may include the combination of areas 521-524 and another aggregated area may include the combination of areas 511-514.

Figure 17:
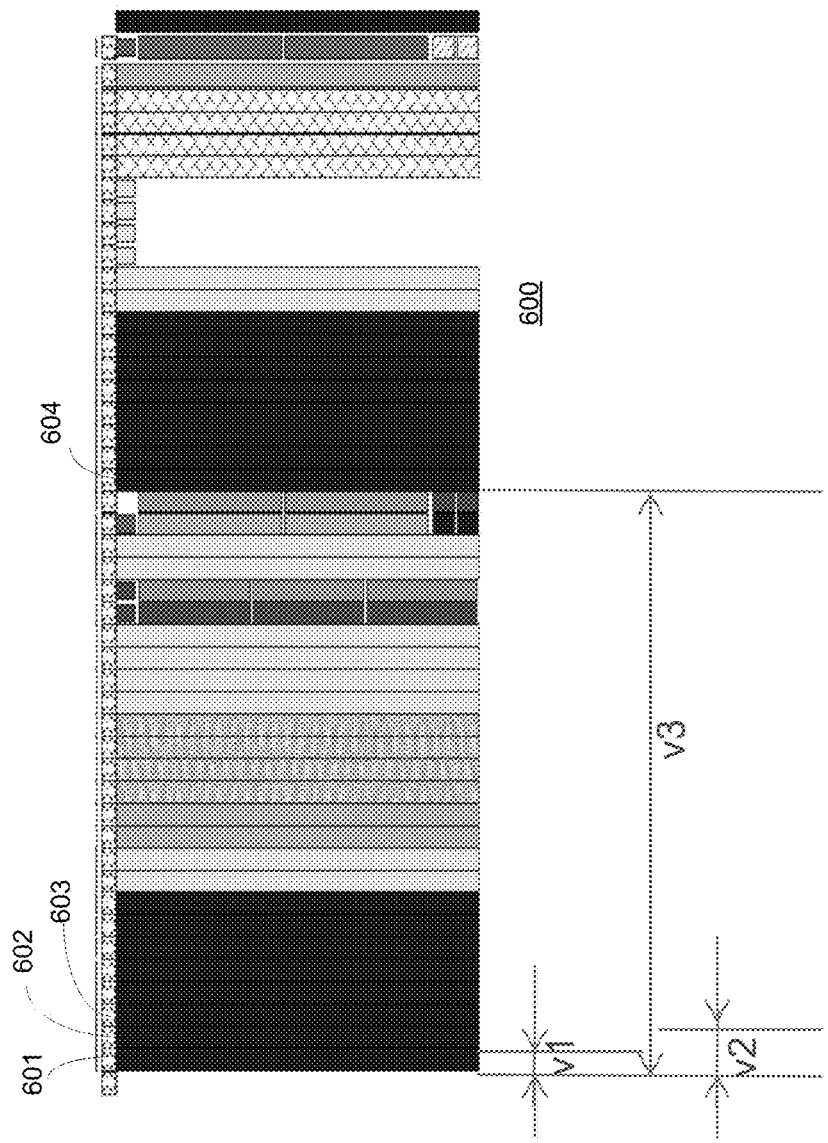

FIG. 17 illustrates an area 600 that include multiple blocks according to an embodiment of the invention.

Area 600 includes various blocks. Block 601 is similar to various blocks such as blocks 602, 603 and 604. The distance between block 601 and block 602 is V1, the distance between block 601 and block 603 is V2 and the distance between block 601 and block 604 is V3. V2 exceeds V1 and is smaller than V3.

FIG. 16 illustrates that the searching for the comparison distance (especially selecting the set of distances from which the comparison distance is selected) may involve starting from distances that are not smaller than V3—ignoring distances that are below a distance threshold that equals V3.

After imposing this limitation and defining aggregated areas other aggregated areas may be searched by allowing the comparison distance to be smaller than V3—reducing the distance threshold. The distance threshold may be reduced to V2 and after defining aggregated areas (using V2)—the distance threshold may be further lowered to V1. Alternatively—the distance threshold may be reduced from V3 to V1 or any other value below V3.

It has been found that the aggregation of blocks may be an iterative process that may involve changing limitation on the comparison distance. The changing may include decreasing the limitations of the comparison distance.

Starting the aggregation from higher limitation on the comparison distance may result in bigger aggregated areas.

Each next iteration of the aggregation may involve decreasing the limitation on the minimal comparison distance until a predefined threshold is reached.

When aggregating along a certain direction the aggregated areas may have a shape of a strip that is wider along the certain direction. One or more strip-shaped aggregated areas may be added to each other to provide a comparable region.

Figure 18:
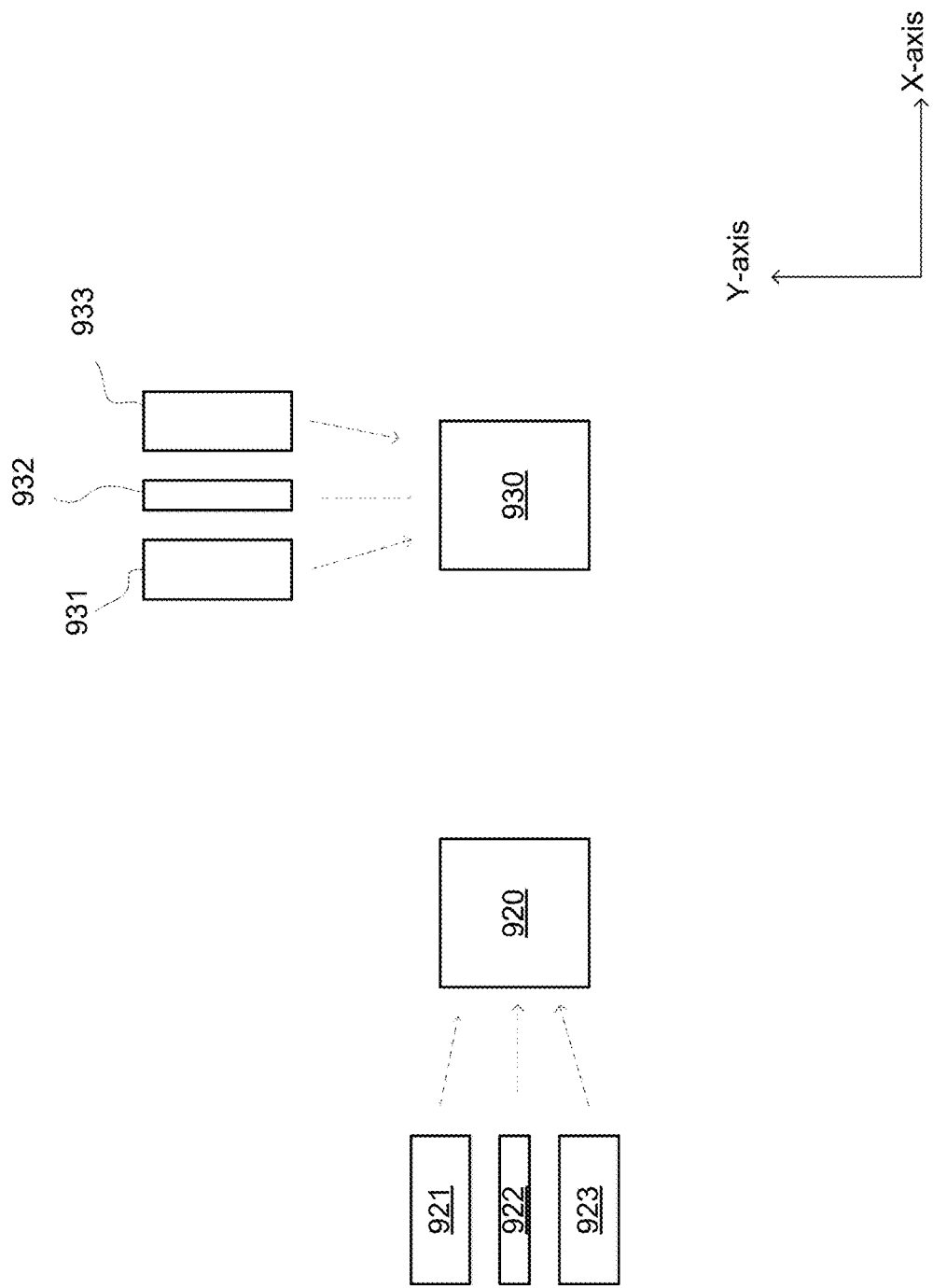

FIG. 18 illustrates comparable regions 920 and 930, X-axis aggregate areas 921, 922 and 923 as well as Y-axis aggregate areas 931, 932 and 933 according to an embodiment of the invention.

X-axis aggregate areas 921, 922 and 923 are strip-shaped areas and are combined to provide comparable region 920.

Y-axis aggregate areas 931, 932 and 933 are strip-shaped areas and are combined to provide comparable region 930.

Any of the aggregate areas mentioned in relation to FIGS. 11-18 may be a comparable region.

Embodiments of the invention, described herein, are aimed at enabling

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for generating an in-die reference of a lithographic mask and using the in-die reference for performing die-to-die defect detection techniques on the lithographic mask using an inspection tool, the method comprising:
    finding similar blocks of the lithographic mask; the similar blocks defined by similar CAD information;
    selecting a comparison distance based on (i) areas of the similar blocks and (ii) spatial relationships between the similar blocks;
    aggregating the similar blocks, based on the comparison distance, to provide multiple aggregated areas;
    defining comparable regions of the lithographic mask based on the multiple aggregated areas, the comparable regions providing the in-die reference; and performing, using the inspection tool, a die-to-die defect detection technique on the lithographic mask using the in-die reference.

2. The method according to claim 1, comprising acquiring images of at least some of the comparable regions; and comparing the images of the at least some of the comparable regions to provide an inspection result.

3. The method according to claim 1, wherein the defining of the comparable regions comprises at least one out of: (i) ignoring aggregated areas that fail to pass a size criterion; and (ii) adding stripe-shaped aggregated areas to each other.

4. The method according to claim 1, wherein the selecting of the comparison distance comprises calculating, for each distance of a set of distances, an aggregate area of similar blocks that are spaced apart by the distance thereby providing a set of aggregate areas.

5. The method according to claim 4, wherein the selecting of the comparison distance comprises finding a highest aggregate area of the set of aggregate areas; and defining the distance associated with the highest aggregate area as the comparison distance.

6. The method according to claim 4, wherein the providing of the set of aggregate areas is preceded by selecting the set of distances; and wherein the selecting of the set of distances comprises ignoring distances that are below a distance threshold.

7. The method according to claim 6, comprising repeating the providing of the set of aggregate areas for different sets of distances.

8. The method according to claim 1 wherein the aggregating of the similar blocks comprises:
defining consecutive stripes, wherein a width of each of the consecutive stripes equals the comparison distance; and
finding within each pair of adjacent stripes of the consecutive stripes, similar blocks that are spaced apart by the comparison distance; and
ignoring blocks within each pair of the adjacent stripes that fail to have similar blocks that are spaced apart by the comparison distance.

9. The method according to claim 1, comprising repeating the steps of selecting the comparison distance, aggregating the similar blocks, and defining the comparable regions for each direction out of multiple directions that are oriented to each other.

10. A non-transitory computer readable medium, comprising instructions for generating an in-die reference of a lithographic mask and for using the in-die reference for performing die-to-die detection techniques on the lithographic mask using an inspection tool, the instructions when executed by a processor, cause the processor to perform operations comprising:
finding similar blocks of the lithographic mask; the similar blocks defined by similar CAD information;
selecting a comparison distance based on (i) areas of the similar blocks and (ii) spatial relationships between the similar blocks;
aggregating the similar blocks, based on the comparison distance, to provide multiple aggregated areas;
defining comparable regions of the lithographic mask based on the multiple aggregated areas, the comparable regions providing the in-die reference; and
performing, using the inspection tool, a die-to-die defect detection technique on the lithographic mask using the in-die reference.

11. A system for generating an in-die reference of a lithographic mask and using the in-die reference for performing die-to-die defect detection techniques on the lithographic mask using an inspection tool, comprising:
a memory; and
a processor, operatively coupled with the memory, the processor configured execute instructions that cause the processor to:
find similar blocks of the lithographic mask; the similar blocks defined by similar CAD information;
select a comparison distance based on (i) areas of the similar blocks and (ii) spatial relationships between the similar blocks;
aggregate the similar blocks, based on the comparison distance, to provide multiple aggregated areas;
define comparable regions of the lithographic mask based on the multiple aggregated areas, the comparable regions providing the in-die reference; and
perform, using the inspection tool, a die-to-die defect detection technique on the lithographic mask using the in-die reference.

12. The system according to claim 11 wherein the system is connected to or integrated with an inspection system capable of inspecting a lithographic mask; and wherein the processor is further configured to:
acquire images of at least some of the comparable regions; and
compare the images of the at least some of the comparable regions to provide an inspection result.

13. The system according to claim 11, wherein to define the comparable regions the processor is further configured to:
(i) ignore aggregated areas that fail to pass a size criterion; and/or (ii) add stripe-shaped aggregated areas to each other.

14. The system according to claim 11, wherein to select, the processor is further configured to:
calculate, for each distance of a set of distances, an aggregate area of similar blocks that are spaced apart by the distance thereby providing a set of aggregate areas.

15. The system according to claim 11, wherein to select, the processor is further configured to:
find a highest aggregate area of the set of aggregate areas; and define the distance associated with the highest aggregate area as the comparison distance.

16. The system according to claim 11, wherein the processor is further configured to:
prior to providing of the set of aggregate areas, select the set of distances by ignoring distances that are below a distance threshold.

17. The system according to claim 16, wherein the processor is further configured to:
repeat the providing of the set of aggregate areas for different sets of distances.

18. The system according to claim 11 wherein to aggregate of the similar blocks the processor is further configured to:
define consecutive stripes, wherein a width of each of the consecutive stripes equals the comparison distance; and
find within each pair of adjacent stripes of the consecutive stripes, similar blocks that are spaced apart by the comparison distance; and
ignore blocks within each pair of the adjacent stripes that fail to have similar blocks that are spaced apart by the comparison distance.

19. The system according to claim 11 wherein the processor is further configured to:

repeat the steps of selecting the comparison distance, aggregating the similar blocks, and defining the comparable regions for each direction out of multiple directions that are oriented to each other.

* * * * *